(12) United States Patent
Kamer et al.

(10) Patent No.: US 8,595,122 B2
(45) Date of Patent: Nov. 26, 2013

(54) SYSTEM FOR MEASURING ELECTRICITY AND METHOD OF PROVIDING AND USING THE SAME

(75) Inventors: Doanld B. Kamer, Phoenix, AZ (US); Robert Page, Phoenix, AZ (US)

(73) Assignee: Electric Transportation Engineering Corporation, Phoenix, AZ (US)

( * ) Notice: Subject to any disclaimer, the term of this patent is extended or adjusted under 35 U.S.C. 154(b) by 0 days.

(21) Appl. No.: 13/442,675

(22) Filed: Apr. 9, 2012

(65) Prior Publication Data

US 2012/0197791 A1 Aug. 2, 2012

Related U.S. Application Data

(63) Continuation of application No. PCT/US2012/029999, filed on Mar. 21, 2012, and a continuation-in-part of application No. PCT/US2011/034667, filed on Apr. 29, 2011, and a continuation-in-part of application No. PCT/US2011/037587, filed on May 23, 2011, and a continuation-in-part of application No. PCT/US2011/037588, filed on May 23, 2011, and a continuation-in-part of application No. PCT/US2011/037590, filed on May 23, 2011, said application No. PCT/US2011/037587 is a continuation-in-part of application No. PCT/US2011/034667, said application No. PCT/US2011/037588 is a continuation-in-part of application No. PCT/US2011/034667, said application No. PCT/US2011/037590 is a continuation-in-part of application No. PCT/US2011/034667.

(60) Provisional application No. 61/488,932, filed on May 23, 2011, provisional application No. 61/367,316, filed on Jul. 23, 2010, provisional application No. 61/367,321, filed on Jul. 23, 2010, provisional application No. 61/367,337, filed on Jul. 23, 2010, provisional application No. 61/367,317, filed on Jul. 23, 2010.

(51) Int. Cl.
*G06Q 40/00* (2012.01)

(52) U.S. Cl.
USPC .............................. 705/37; 320/109; 320/162

(58) Field of Classification Search
None
See application file for complete search history.

(56) References Cited

U.S. PATENT DOCUMENTS 4,532,418 A 7/1985 Meese et al.
5,057,762 A 10/1991 Goedken et al.
(Continued)

FOREIGN PATENT DOCUMENTS

EP 0533317 A2 3/1993
EP 1458039 A2 9/2004
(Continued)

OTHER PUBLICATIONS

International Search Report and Written Opinion for corresponding Int'l Application No. PCT/US2011/037590 dated Dec. 20, 2011.

(Continued)

*Primary Examiner* — Gregory Johnson
(74) *Attorney, Agent, or Firm* — Bryan Cave LLP

(57) ABSTRACT

Some embodiments include a system for measuring electricity. Other embodiments of related systems and methods are also disclosed.

32 Claims, 5 Drawing Sheets

(56) References Cited

U.S. PATENT DOCUMENTS

| | | |
|---|---|---|
| 5,202,617 A | 4/1993 | Nor |
| 5,327,066 A | 7/1994 | Smith |
| 5,341,083 A | 8/1994 | Klontz et al. |
| 5,548,200 A | 8/1996 | Nor et al. |
| 5,594,318 A | 1/1997 | Nor et al. |
| 5,705,910 A | 1/1998 | Kito et al. |
| 6,029,072 A | 2/2000 | Barber |
| 6,373,380 B1 | 4/2002 | Robertson et al. |
| 6,725,104 B2 | 4/2004 | Lo et al. |
| 7,045,989 B2 | 5/2006 | Sakakibara et al. |
| 7,116,079 B2 | 10/2006 | Bayne et al. |
| 7,135,836 B2 | 11/2006 | Kutkut et al. |
| 7,196,494 B2 | 3/2007 | Baumgartner |
| 7,253,586 B2 | 8/2007 | Kangas et al. |
| 7,274,975 B2 | 9/2007 | Miller |
| 7,358,701 B2 | 4/2008 | Field et al. |
| 7,376,631 B2 | 5/2008 | King et al. |
| 7,405,660 B2 | 7/2008 | Diorio et al. |
| 7,444,192 B2 | 10/2008 | Dickinson et al. |
| 7,546,214 B2 | 6/2009 | Rivers, Jr. et al. |
| 7,590,472 B2 | 9/2009 | Hakim et al. |
| 7,595,607 B2 | 9/2009 | Lambert et al. |
| 7,622,897 B2 | 11/2009 | Eberhard et al. |
| 7,629,772 B2 | 12/2009 | Eberhard et al. |
| 7,629,773 B2 | 12/2009 | Eberhard et al. |
| 7,671,567 B2 | 3/2010 | Eberhard et al. |
| 7,679,336 B2 | 3/2010 | Gale et al. |
| 7,688,022 B2 | 3/2010 | Alvarez-Troncoso et al. |
| 7,698,078 B2 | 4/2010 | Kelty et al. |
| 7,719,232 B2 | 5/2010 | Kelty et al. |
| 7,747,739 B2 | 6/2010 | Bridges et al. |
| 7,756,507 B2 | 7/2010 | Morper |
| 7,782,021 B2 | 8/2010 | Kelty et al. |
| 7,783,390 B2 | 8/2010 | Miller |
| 7,786,704 B2 | 8/2010 | Kelty et al. |
| 7,804,274 B2 | 9/2010 | Baxter et al. |
| 7,844,370 B2 | 11/2010 | Pollack et al. |
| 7,886,166 B2 | 2/2011 | Shnekendorf et al. |
| 7,906,937 B2 | 3/2011 | Bhade et al. |
| 7,917,251 B2 | 3/2011 | Kressner et al. |
| 7,949,435 B2 | 5/2011 | Pollack et al. |
| 7,952,319 B2 | 5/2011 | Lowenthal et al. |
| 7,952,325 B2 | 5/2011 | Baxter et al. |
| 7,956,570 B2 | 6/2011 | Lowenthal et al. |
| 7,957,846 B2 | 6/2011 | Hakim et al. |
| 2006/0089844 A1 | 4/2006 | Dickinson et al. |
| 2006/0158037 A1 | 7/2006 | Danley et al. |
| 2006/0276938 A1 | 12/2006 | Miller |
| 2007/0203860 A1 | 8/2007 | Golden et al. |
| 2007/0271006 A1 | 11/2007 | Golden et al. |
| 2007/0276547 A1 | 11/2007 | Miller |
| 2008/0039979 A1 | 2/2008 | Bridges et al. |
| 2008/0039980 A1 | 2/2008 | Pollack et al. |
| 2008/0039989 A1 | 2/2008 | Pollack et al. |
| 2008/0040223 A1* | 2/2008 | Bridges et al. ................. 705/14 |
| 2008/0040263 A1 | 2/2008 | Pollack et al. |
| 2008/0040295 A1 | 2/2008 | Kaplan et al. |
| 2008/0040296 A1 | 2/2008 | Bridges et al. |
| 2008/0040479 A1 | 2/2008 | Bridges et al. |
| 2008/0052145 A1 | 2/2008 | Kaplan et al. |
| 2008/0114499 A1 | 5/2008 | Hakim et al. |
| 2008/0136371 A1 | 6/2008 | Sutardja |
| 2008/0167756 A1 | 7/2008 | Golden et al. |
| 2008/0203973 A1 | 8/2008 | Gale et al. |
| 2008/0228533 A1 | 9/2008 | McGuire et al. |
| 2008/0249965 A1 | 10/2008 | Pollack et al. |
| 2008/0281663 A1 | 11/2008 | Hakim et al. |
| 2008/0312782 A1 | 12/2008 | Berdichevsky et al. |
| 2009/0018706 A1 | 1/2009 | Wittner |
| 2009/0024232 A1 | 1/2009 | Dickinson et al. |
| 2009/0024255 A1 | 1/2009 | Penzenstadler et al. |
| 2009/0024545 A1 | 1/2009 | Golden et al. |
| 2009/0030712 A1 | 1/2009 | Bogolea et al. |
| 2009/0040029 A1 | 2/2009 | Bridges et al. |
| 2009/0043519 A1 | 2/2009 | Bridges et al. |
| 2009/0043520 A1 | 2/2009 | Pollack et al. |
| 2009/0063680 A1 | 3/2009 | Bridges et al. |
| 2009/0066287 A1 | 3/2009 | Pollack et al. |
| 2009/0077397 A1 | 3/2009 | Shnekendorf et al. |
| 2009/0082957 A1 | 3/2009 | Agassi et al. |
| 2009/0088907 A1 | 4/2009 | Lewis et al. |
| 2009/0091291 A1 | 4/2009 | Woody et al. |
| 2009/0140698 A1 | 6/2009 | Eberhard et al. |
| 2009/0177580 A1 | 7/2009 | Lowenthal et al. |
| 2009/0177595 A1* | 7/2009 | Dunlap et al. ................. 705/412 |
| 2009/0195349 A1* | 8/2009 | Frader-Thompson et al. 340/3.1 |
| 2009/0200988 A1 | 8/2009 | Bridges et al. |
| 2009/0210357 A1 | 8/2009 | Pudar et al. |
| 2009/0228388 A1 | 9/2009 | Axelrod et al. |
| 2009/0259603 A1 | 10/2009 | Housh et al. |
| 2009/0313098 A1 | 12/2009 | Hafner et al. |
| 2009/0326729 A1 | 12/2009 | Hakim et al. |
| 2010/0006356 A1 | 1/2010 | Curry et al. |
| 2010/0057480 A1* | 3/2010 | Arfin et al. ................. 705/1 |
| 2010/0094496 A1 | 4/2010 | Hershkovitz et al. |
| 2010/0100342 A1 | 4/2010 | Kressner et al. |
| 2010/0134067 A1 | 6/2010 | Baxter et al. |
| 2010/0138178 A1 | 6/2010 | Paryani et al. |
| 2010/0138363 A1* | 6/2010 | Batterberry et al. .......... 705/412 |
| 2010/0145885 A1* | 6/2010 | Graziano et al. ............. 705/412 |
| 2010/0161517 A1 | 6/2010 | Littrell |
| 2010/0161518 A1 | 6/2010 | Littrell |
| 2010/0164439 A1 | 7/2010 | Ido |
| 2010/0188043 A1 | 7/2010 | Kelty et al. |
| 2010/0207448 A1* | 8/2010 | Cooper et al. ................. 307/20 |
| 2010/0207588 A1 | 8/2010 | Lowenthal et al. |
| 2010/0211340 A1 | 8/2010 | Lowenthal et al. |
| 2010/0211643 A1 | 8/2010 | Lowenthal et al. |
| 2010/0217549 A1* | 8/2010 | Galvin et al. ................... 702/62 |
| 2010/0235010 A1* | 9/2010 | Cooper et al. ................. 700/295 |
| 2010/0238596 A1 | 9/2010 | Wittner |
| 2010/0259213 A1 | 10/2010 | Maharaj |
| 2010/0289451 A1 | 11/2010 | Tuffner et al. |
| 2010/0292857 A1* | 11/2010 | Bose et al. ................... 700/292 |
| 2010/0295508 A1 | 11/2010 | Mueller et al. |
| 2010/0301809 A1 | 12/2010 | Bhade et al. |
| 2010/0315089 A1 | 12/2010 | Rapich |
| 2010/0315197 A1 | 12/2010 | Solomon et al. |
| 2010/0332076 A1 | 12/2010 | Dickinson et al. |
| 2010/0332373 A1* | 12/2010 | Crabtree et al. ................. 705/37 |
| 2011/0001356 A1 | 1/2011 | Pollack |
| 2011/0004358 A1 | 1/2011 | Pollack et al. |
| 2011/0004406 A1 | 1/2011 | Davis |
| 2011/0007824 A1 | 1/2011 | Bridges et al. |
| 2011/0010043 A1 | 1/2011 | Lafky |
| 2011/0010158 A1 | 1/2011 | Bridges |
| 2011/0015799 A1 | 1/2011 | Pollack et al. |
| 2011/0016063 A1 | 1/2011 | Pollack et al. |
| 2011/0025556 A1 | 2/2011 | Bridges et al. |
| 2011/0029144 A1 | 2/2011 | Muller et al. |
| 2011/0029146 A1 | 2/2011 | Muller et al. |
| 2011/0029157 A1 | 2/2011 | Muzaffer |
| 2011/0037429 A1* | 2/2011 | DeBoer et al. ................. 320/109 |
| 2011/0040666 A1* | 2/2011 | Crabtree et al. ................. 705/37 |
| 2011/0043163 A1 | 2/2011 | Baarman |
| 2011/0050168 A1 | 3/2011 | Yoo et al. |
| 2011/0055037 A1 | 3/2011 | Hayashigawa et al. |
| 2011/0061014 A1 | 3/2011 | Frader-Thompson et al. |
| 2011/0071932 A1 | 3/2011 | Agassi et al. |
| 2011/0072112 A1 | 3/2011 | Kaplan |
| 2011/0082598 A1* | 4/2011 | Boretto et al. ................. 700/291 |
| 2011/0095723 A1 | 4/2011 | Bhade et al. |
| 2011/0106327 A1 | 5/2011 | Zhou et al. |
| 2011/0106328 A1 | 5/2011 | Zhou et al. |
| 2011/0106329 A1 | 5/2011 | Donnelly et al. |
| 2011/0121791 A1* | 5/2011 | Basham et al. ................. 320/162 |
| 2011/0169447 A1 | 7/2011 | Brown et al. |
| 2011/0172837 A1* | 7/2011 | Forbes, Jr. ................... 700/291 |
| 2011/0172841 A1* | 7/2011 | Forbes, Jr. ................... 700/292 |
| 2011/0202195 A1* | 8/2011 | Finch et al. ................... 700/295 |
| 2012/0032636 A1* | 2/2012 | Bianco ................... 320/109 |
| 2012/0054125 A1 | 3/2012 | Clifton et al. ................. 705/412 |
| 2012/0123995 A1* | 5/2012 | Boot ........................... 706/54 |
| 2012/0161797 A1* | 6/2012 | Hein ........................... 324/705 |

(56) References Cited

U.S. PATENT DOCUMENTS

| | | | | |
|---|---|---|---|---|
| 2012/0197791 A1* | 8/2012 | Karner et al. | | 705/40 |
| 2012/0201155 A1* | 8/2012 | Du et al. | | 370/252 |
| 2012/0223675 A1* | 9/2012 | Bianco | | 320/109 |

FOREIGN PATENT DOCUMENTS

| | | | |
|---|---|---|---|
| EP | 1458039 | A3 | 2/2010 |
| EP | 2199143 | A1 | 6/2010 |
| JP | 06-290836 | A | 10/1994 |
| JP | 07-036644 | A | 2/1995 |
| JP | 10-117405 | A | 5/1998 |
| JP | 11-503599 | A | 3/1999 |
| JP | 3263075 | B2 | 3/2002 |
| JP | 2004-096973 | A | 3/2004 |
| JP | 2006-074868 | A | 3/2006 |
| JP | 2006-178259 | A | 7/2006 |
| JP | 2006-287705 | A | 10/2006 |
| JP | 2008-083022 | A | 4/2008 |
| JP | 2009-141991 | A | 6/2009 |
| JP | 2010-110044 | A | 5/2010 |
| JP | 2010-114988 | A | 5/2010 |
| KR | 10-0460879 | B1 | 12/2004 |
| KR | 10-0824073 | B1 | 4/2008 |
| KR | 10-2009-125560 | A | 12/2009 |
| KR | 2010-0035152 | A | 4/2010 |
| WO | 2010-060370 | A1 | 6/2010 |
| WO | 2010120551 | A1 | 10/2010 |
| WO | 2010132495 | A2 | 11/2010 |
| WO | 2011-032104 | A1 | 3/2011 |

OTHER PUBLICATIONS

International Search Report and Written Opinion for corresponding Int'l Application No. PCT/US2011/037588 dated Feb. 9, 2012.
International Search Report and Written Opinion for corresponding Int'l Application No. PCT/US2011/037587 dated Dec. 16, 2011.
International Search Report and Written Opinion for corresponding Int'l Application No. PCT/US2011/034667 dated Feb. 8, 2012.
International Search Report and Written Opinion for corresponding Int'l Application No. PCT/US2012/029995 dated Jun. 12, 2012.
International Search Report and Written Opinion for corresponding Int'l Application No. PCT/US2012/030000 dated Jul. 2, 2012.
International Search Report and Written Opinion for corresponding Int'l Application No. PCT/US2012/029999 dated Oct. 12, 2012.

* cited by examiner

SYSTEM FOR MEASURING ELECTRICITY AND METHOD OF PROVIDING AND USING THE SAME

CROSS-REFERENCE TO RELATED APPLICATIONS

This application is a continuation of PCT Application No. PCT/US12/29999 filed Mar. 21, 2012, which application claims the benefit of U.S. Provisional Application No. 61/488,932, filed May 23, 2011. Further, this application is a continuation-in-part of: (1) PCT Application No. PCT/US2011/034667, filed Apr. 29, 2011; (2) PCT Application No. PCT/US2011/037587, filed May 23, 2011; (3) PCT Application No. PCT/US2011/037588, filed May 23, 2011; and (4) PCT Application No. PCT/US2011/037590, filed May 23, 2011.

PCT Application No. PCT/US2011/034667, PCT Application No. PCT/US2011/037587, PCT Application No. PCT/US2011/037588, and PCT Application No. PCT/US2011/037590 each claim the benefit of: (1) U.S. Provisional Application No. 61/367,316, filed Jul. 23, 2010; (2) U.S. Provisional Application No. 61/367,321, filed Jul. 23, 2010; (3) U.S. Provisional Application No. 61/367,337, filed Jul. 23, 2010; and (4) U.S. Provisional Application No. 61/367,317, filed Jul. 23, 2010. Further, PCT Application No. PCT/US2011/037587, PCT Application No. PCT/US2011/037588, and PCT Application No. PCT/US2011/037590 each are a continuation-in-part of PCT Application No. PCT/US2011/034667.

PCT Application No. PCT/US12/29999, U.S. Provisional Application No. 61/488,932, PCT Application No. PCT/US2011/034667, PCT Application No. PCT/US2011/037587, PCT Application No. PCT/US2011/037588, PCT Application No. PCT/US2011/037590, U.S. Provisional Application No. 61/367,316, U.S. Provisional Application No. 61/367,321, U.S. Provisional Application No. 61/367,337, and U.S. Provisional Application No. 61/367,317 are each incorporated herein by reference in their entirety.

STATEMENT REGARDING FEDERALLY SPONSORED RESEARCH OR DEVELOPMENT

This invention was made with U.S. Government support under Contract No. DE-EE00002194 awarded by the Department of Energy. The U.S. Government has certain rights in this invention.

FIELD OF THE INVENTION

This invention relates generally to systems for measuring electricity, and relates more particularly to such systems for discretely measuring electricity provided to and/or from multiple electric loads and methods of providing and using the same.

DESCRIPTION OF THE BACKGROUND

In an effort to promote usage of electric vehicles rather than internal combustion vehicles, some electric utility companies have proposed charging a lower rate for electricity provided to charge electric vehicles than the rate ordinarily applied to electricity for other conventional uses (e.g., powering personal residences, powering businesses, etc.). As demand for petroleum-based fuels increases and supply for petroleum-based fuels decreases, even more electric utility companies may propose this pricing model. Meanwhile, beyond electricity pricing schemes, numerous other reasons may exist why it may be desirable to separately measure the electricity used to charge an electric vehicle from the electricity provided to the remainder of a residence and/or a business. For example, separately measuring the electricity used to charge an electric vehicle may prove useful to researchers conducting analytical research and/or to consumers desiring to budget personal electricity consumption.

However, distinguishing the electricity provided to charge an electric vehicle from the electricity provided to the remainder of a personal residence and/or a business can present various challenges. For example, technologies for identifying electricity usage by identifying or segregating individual electric loads through a single connection to the local electric grid may be complicated and/or cost prohibitive. Likewise, attempting to separately measure electricity by configuring multiple electric systems with multiple parallel connections to the electric grid may not only be cost prohibitive, but may also raise significant legal concerns. For example, legal regulations may limit a personal residence and/or a business to a single electric mains. Other concerns for separately measuring electricity include precluding electricity diversion (e.g., covertly routing electricity intended for charging an electric vehicle to use for other purposes in order to illegally benefit from the cost savings) and proximity of a personal residence, such as an apartment, and/or a business to the electric mains.

Accordingly, a need or potential for benefit exists for systems and methods that allow for measuring electricity that is reliable, cost effective, and/or easy to operate/perform.

BRIEF DESCRIPTION OF THE DRAWINGS

To facilitate further description of the embodiments, the following drawings are provided in which.

Figure 1:
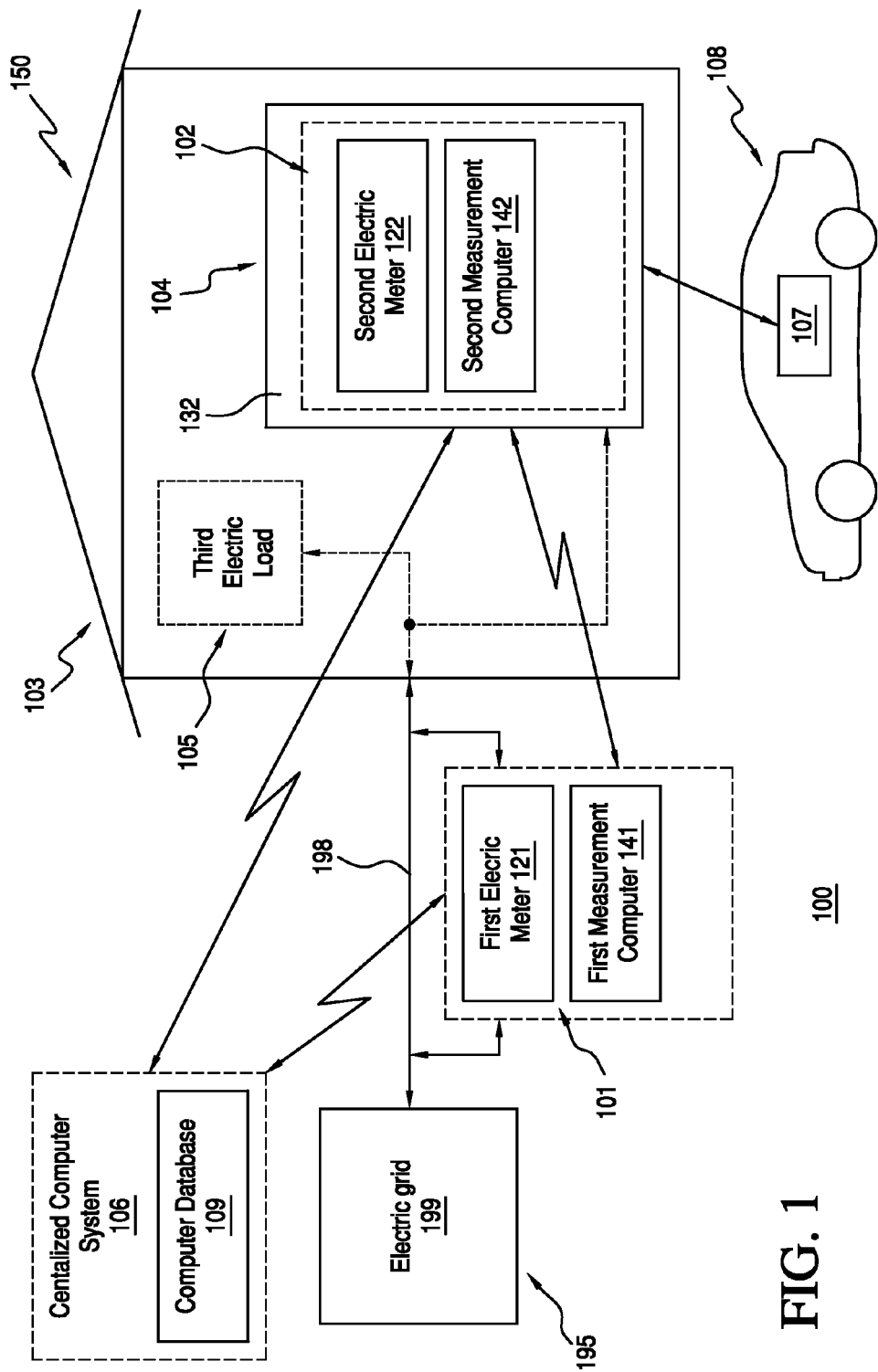
FIG. 1 illustrates an exemplary system for measuring electricity, according to an embodiment.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled, but not be mechanically or otherwise coupled; two or more mechanical elements may be mechanically coupled, but not be electrically or otherwise coupled; two or more electrical elements may be mechanically coupled, but not be electrically or otherwise coupled. Coupling may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types.

The absence of the word "removably," "removable," and the like near the word "coupled," and the like does not mean that the coupling, etc. in question is or is not removable.

The term "real time" is defined with respect to operations carried out as soon as practically possible upon occurrence of a triggering event. A triggering event can comprise receipt of data necessary to execute a task or to otherwise process information. Because of delays inherent in transmission and/or in computing speeds, the term "real time" encompasses operations that occur in "near" real time or somewhat delayed from a triggering event.

The term "coordinate" and similar forms of the term "coordinate," when used in the context of taking one or more measurements, are defined as being coordinated within an error tolerance of at least one of 2%, 1%, 0.5%, or 0.1% margin of error. The term "approximately synchronize" and similar forms of the term "approximately synchronize," when used in the context of taking coordinating one or more measurements, are defined as being synchronized within an error tolerance of at least one of 2%, 1%, 0.5%, or 0.1% margin of error.

DETAILED DESCRIPTION OF EXAMPLES OF EMBODIMENTS

Some embodiments include a system for measuring electricity. The system comprises a first measurement module configured to measure a first measurement of a first quantity of electricity provided to a first electric load and a second measurement module configured to measure a second measurement of a second quantity of electricity provided to a second electric load. The first electric load can comprise the second electric load and a third electric load, and the second electric load can comprise an electric load of an electric vehicle charging station. The first quantity of electricity provided to the first electric load can comprise the second quantity of electricity provided to the second electric load. In the same or different embodiments, the first measurement module can be configured to coordinate measuring the first measurement with the second measurement module measuring the second measurement, and/or the second measurement module can be configured to coordinate measuring the second measurement with the first measurement module measuring the first measurement.

Various embodiments include a method of providing a system for measuring electricity. The method comprises: providing a second measurement module configured to measure a second measurement of a second quantity of electricity provided to a second electric load, the second electric load comprising an electric load of an electric vehicle charging station; and tuning at least one of: (a) the second measurement module to coordinate measuring the second measurement of the second quantity of electricity provided to the second electric load with a first measurement of a first quantity of electricity provided to a first electric load measured by a first measurement module or (b) the first measurement module to coordinate measuring the first measurement of the first quantity of electricity provided to the first electric load with the second measurement of the second quantity of electricity provided to the second electric load measured by the second measurement module. In many embodiments, the first electric load comprises the second electric load and a third electric load. In the same or different embodiments, the first quantity of electricity provided to the first electric load comprises the second quantity of electricity provided to the second electric load.

Further embodiments include a method of measuring electricity. The method comprises: measuring a first measurement of a first quantity of electricity provided to a first electric load, the first electric load comprising a second electric load of an electric vehicle charging station and a third electric load, and the first quantity of electricity comprising a second quantity of electricity provided to the second electric load; and measuring a second measurement of the second quantity of electricity provided to the second electric load. In many embodiments, measuring the first measurement is coordinated with measuring the second measurement, and/or measuring the second measurement is coordinated with measuring the first measurement.

Turning to the drawings, FIG. 1 illustrates system 100 for measuring electricity, according to an embodiment of system 100. System 100 is merely exemplary and is not limited to the embodiments presented herein. System 100 can be employed in many different embodiments or examples not specifically depicted or described herein. In some embodiments, all or part of system 100 can be configured to operate in real time.

System 100 comprises first measurement module 101 and second measurement module 102. Meanwhile, first measurement module 101 can comprise first electric meter 121 and/or first measurement computer 141, and second measurement module 102 can comprise second electric meter 122 and/or second measurement computer 142. Furthermore, one or each of first measurement module 101 and/or second measurement module 102 can comprise a time-keeping device (e.g., a clock). For example, first measurement module 101 can comprise a first time-keeping device, and/or second measurement module 102 can comprise a second time-keeping device. In many embodiments, the first time-keeping device, first electric meter 121, and/or first measurement computer 141 can be integrated with each other. Likewise, the second time-keeping device, second electric meter 122, and/or second measurement computer 142 can be integrated with each other.

System 100 can also comprise centralized computer system 106. In other embodiments, centralized computer system 106 can be separate from system 100. Centralized computer system 106 can comprise a centralized time-keeping device (e.g., clock).

First measurement module 101, second measurement module 102, and/or centralized computer system 106 can be configured to communicate with each other via a communication network. In embodiments where centralized computer system 106 is separate from system 100, system 100 can be configured to communicate with centralized computer system 106 via the communication network. Likewise, the first time-keeping device, first electric meter 121, and/or first measurement computer 141 can be configured to communicate with each other via the communication network, and the second time-keeping device, second electric meter 122, and/or second measurement computer 142 can be configured to communicate with each other via the communication network.

Accordingly, in many embodiments, system 100 can comprise the communication network. The communication network can comprise (a) one or more components configured to provide wired communication (e.g., one or more data buses, such as, for example, universal serial bus(es); one or more networking cables, such as, for example, coaxial cable(s), optical fiber cable(s), twisted pair cable(s); any other suitable data cable, etc.) and/or (b) one or more components configured to provide wireless communication (e.g., one or more radio transceivers, one or more infrared transceivers, etc.). Further, the communication network can be configured to operate using any one or any combination of wired and/or wireless communication network topologies (e.g., ring, line, tree, bus, mesh, star, daisy chain, hybrid, etc.) and/or protocols (e.g., personal area network (PAN) protocol(s), local area network (LAN) protocol(s), wide area network (WAN) protocol(s), cellular network protocol(s), Powerline network protocol(s), etc.). Exemplary PAN protocol(s) can comprise Bluetooth, Zigbee, Wireless Universal Serial Bus (USB), Z-Wave, etc.; exemplary LAN and/or WAN protocol(s) can comprise Institute of Electrical and Electronic Engineers (IEEE) 802.3, IEEE 802.11, etc.; and exemplary wireless cellular network protocol(s) can comprise Global System for Mobile Communications (GSM), General Packet Radio Service (GPRS), Code Division Multiple Access (CDMA), Evolution-Data Optimized (EV-DO), Enhanced Data Rates for GSM Evolution (EDGE), 3GSM, Digital Enhanced Cordless Telecommunications (DECT), Digital AMPS (IS-136/Time Division Multiple Access (TDMA)), Integrated Digital Enhanced Network (iDEN), etc. The components forming the communication network can be dependent on the network topologies and/or protocols in use, and vice versa.

First measurement module 101 is configured to measure a first measurement of a first quantity of electricity provided to first electric load 103, and second measurement module 102 is configured to measure a second measurement of a second quantity of electricity provided to second electric load 104. In many embodiments, first measurement module 101 and/or second measurement module 102 can be configured to operate in real time.

First electric meter 121 can be configured to measure electricity (e.g., to measure the first measurement of the first quantity of electricity provided to first electric load 103), and second electric meter 122 can also be configured to measure electricity (e.g., to measure the second measurement of the second quantity of electricity provided to second electric load 104). First electric meter 121 and/or second electric meter 122 can each comprise one of an electronic electric meter or an electromechanical electric meter. In many embodiments, the electric meter can comprise a smart electric meter. First electric meter 121 and second electric meter 122 can be similar or identical to each other in some embodiments. Accordingly, first electric meter 121 and second electric meter 122 can be the same type of electric meter in some examples and different types of electric meters in other examples. For example, first electric meter 121 and second electric meter 122 can both comprise smart and/or electronic electric meters. Meanwhile, in other examples, first electric meter 121 can comprise an electromechanical meter, and second electric meter 122 can comprise a smart electronic electric meter, or vice versa.

First electric load 103 can comprise an electric load of one of one or more buildings (e.g., one or more personal residences—houses, condominiums, apartments, etc., and/or one or more businesses—stores, hotels, fueling stations, airports, housing complexes, business complexes, high rise buildings, industrial complexes, etc.) and/or the corresponding properties of the one or more buildings (e.g., parking lots, etc.), referred to collectively herein as the "one or more buildings 150." In many embodiments, first electric load 103 can comprise second electric load 104 and/or third electric load 105, as illustrated in FIG. 1. Accordingly, the electric load of one or more buildings 150 can comprise second electric load 104 and third electric load 105.

Meanwhile, second electric load 104 can comprise an electric load of electric vehicle charging station 132. In many embodiments, the electric load of electric vehicle charging station 132 can comprise a vehicle electric load provided from electric vehicle charging station 132 to rechargeable energy storage system 107 of electric vehicle 108, a vehicle electric load provided from rechargeable energy storage system 107 of electric vehicle 108 to electric vehicle charging station 132, and/or a charging station load required to operate electric vehicle charging station 132. In various embodiments, electric vehicle charging station 132 can comprise second measurement module 102. In the same or different embodiments, second measurement module 102 can be integral with (e.g., part of and/or inside of) electric vehicle charging station 132. Integrating second measurement module 102 with electric vehicle charging station 132 can help to prevent electricity diversion by increasing the difficulty of diverting electricity from one or more electric lines providing electricity to second electric load 102 at a junction downstream of second measurement module 102. For example, where second measurement module 102 is inside of electric vehicle charging station 132, a chassis or enclosure of electric vehicle charging station 132 can make it more difficult for someone to tamper with second measurement module 102 for purposes of diverting energy. In other embodiments, second measurement module 102 can be separate from electric vehicle charging station 132, but electrically coupled to electric vehicle charging station 132.

Electric vehicle charging station 132 can comprise electric vehicle supply equipment (e.g., a device for providing electricity to a rechargeable energy storage system (e.g., rechargeable energy storage system 107) of an electric vehicle (e.g., electric vehicle 108)). In other embodiments, electric vehicle charging station 132 can comprise an industrial electric charger (e.g., an on-board AC electric charger, a off-board DC electric charger). In some embodiments, electric vehicle charging station 132 can be configured to transfer electricity to a rechargeable energy storage system of the at least one electric vehicle via electrical conduction and/or induction. Further, electric vehicle charging station 132 can comprise either of a stand-alone unit or a wall-mounted unit.

The electric vehicle supply equipment can comprise any suitable alternating current and/or direct current electric vehicle supply equipment. For example, multiple electricity transfer systems 101 can comprise electric vehicle supply equipment configured according to any one of the Society of Automotive Engineers (SAE) International electric vehicle supply equipment standards (e.g., Level 1, Level 2, and/or Level 3) and/or the International Electrotechnical Commission (IEC) standards (e.g., Mode 1, Mode 2, Mode 3, and/or Mode 4). In some embodiments, Level 2 electric vehicle supply equipment and/or Level 3 electric vehicle supply equipment can also be referred to as a fast charger. In many embodiments, the electric vehicle supply equipment can make available electricity comprising a maximum electric current of 30 amperes (A) or 48 A. When the maximum electric current of the electric vehicle supply equipment comprises 30 A, the electric vehicle supply equipment can be configured to make available electricity comprising an electric current of one or more of 12 A, 16 A, or 24 A. When the maximum electric current of the electric vehicle supply equipment comprises 48 A, the electric vehicle supply equipment can be configured to make available electricity comprising an electric current of one or more of 12 A, 16 A, 24 A, or 30 A.

In some examples, Level 1 AC electric vehicle supply equipment can make available electricity comprising an electric voltage of approximately 120 volts (V) and an electric current: (a) greater than or equal to approximately 0 amperes (A) and less than or equal to approximately 12 A AC, when employing a 15 A breaker, or (b) greater than or equal to approximately 0 A and less than or equal to approximately 16 A AC, when employing a 20 A breaker. Accordingly, Level 1 electric vehicle supply equipment can comprise a standard grounded domestic electrical outlet. Meanwhile, Level 2 AC electric vehicle supply equipment can make available electricity comprising an electric voltage greater than or equal to approximately 208 V and less than or equal to approximately 240 V and an electric current greater than or equal to approximately 0 A and less than or equal to approximately 80 A AC. Furthermore, Level 3 electric vehicle supply equipment can make available electricity comprising an electric voltage greater than or equal to approximately 208 V and an electric current greater than or equal to approximately 80 A AC (e.g., 240 V AC (single phase), 208 V AC (triple phase), 480 V AC (triple phase). In some embodiments, the electric voltages for Level 1 electric vehicle supply equipment, Level 2 electric vehicle supply equipment, and/or Level 3 electric vehicle supply equipment can be within plus or minus (±) ten percent (%) tolerances of the electric voltages provided above.

In other examples, Level 1 DC electric vehicle supply equipment can provide electric power greater than or equal to approximately 0 kiloWatts (kW) and less than or equal to approximately 19 kW. Meanwhile, Level 2 DC electric vehicle supply equipment can provide electric power greater than or equal to approximately 19 kW and less than or equal to approximately 90 kW. Furthermore, Level 3 electric vehicle supply equipment can provide electric power greater than or equal to approximately 90 kW. In some embodiments, the term fast charger can refer to an electric vehicle supply equipment providing electricity comprising an electric voltage between approximately 300 V-500 V and an electric current between approximately 100 A-400 A DC.

The industrial electric charger (e.g., the on-board AC electric charger, the off-board DC electric charger) can provide electric power greater than or equal to approximately 3 kW and less than or equal to approximately 33 kW. The off-board DC electric charger can provide electricity comprising an electric voltage greater than or equal to approximately 18 V DC and less than or equal to approximately 120 V DC.

Electric vehicle 108 can comprise one of a car, a truck, a motorcycle, a bicycle, a scooter, a boat, a train, an aircraft, an airport ground support equipment, a material handling equipment (e.g., a fork-lift), etc. In the same or different embodiments, electric vehicle 108 can comprise one of a full electric vehicle or any other grid-connected vehicle.

Rechargeable energy storage system 107 can be configured to provide electricity to electric vehicle 108 to provide motive (e.g., traction) electrical power to electric vehicle 108 and/or to provide electricity to any electrically operated components of electric vehicle 108. In specific examples, rechargeable energy storage system 107 can comprise (a) one or more batteries and/or one or more fuel cells, (b) one or more capacitive energy storage systems (e.g., super capacitors such as electric double-layer capacitors), and/or (c) one or more inertial energy storage systems (e.g., one or more flywheels). In many embodiments, the one or more batteries can comprise one or more rechargeable and/or non-rechargeable batteries. For example, the one or more batteries can comprise one or more lead-acid batteries, valve regulated lead acid (VRLA) batteries such as gel batteries and/or absorbed glass mat (AGM) batteries, nickel-cadmium (NiCd) batteries, nickel-zinc (NiZn) batteries, nickel metal hydride (NiMH) batteries, zebra (e.g., molten chloroaluminate ($NaAlCl_4$)) batteries, and/or lithium (e.g., lithium-ion (Li-ion)) batteries. In some embodiments, where recharge energy storage system 107 comprises multiple batteries, the batteries can all comprise the same type of battery or can comprise multiple types of batteries. Meanwhile, in various embodiments, the fuel cell(s) can comprise at least one hydrogen fuel cell.

Third electric load 105 can comprise a structure electric load that is for one or more structures (e.g., the one or more buildings 150, etc.) in which and/or at which one or more electric vehicle charging stations (such as electric vehicle charging station 132) are located, but that does not include the electric load of electric vehicle charging station 132. For example, in a residential application, third electric load 105 could comprise any of various electrical devices such as heat, ventilation, and air condition (HVAC) devices, washing machines, clothes driers, stoves, ovens, microwaves, televisions, lights, personal computers, vacuums, hair dryers, pool pumps, any other similar electric appliances, etc. Meanwhile, in a commercial or industrial application, third electric load 105 could comprise any of various electrical devices including lights, HVAC devices, personal computers, computer servers, devices for manufacturing, any commercial and/or industrial electric appliances, etc. In either case, third electric load 105 would not include the electric load of electric vehicle charging station 132. In some embodiments, the sum of second electric load 104 and third electric load 105 equals first electric load 103.

In many embodiments, first electric load 103 can be electrically coupled to electric grid 199 of one or more electric utility companies by main electric distribution line 198. In the same or different embodiments, the first quantity of electricity provided to first electric load 103 can be provided from electric grid 199 via main electric distribution line 198. In further embodiments, measurement module 101 can be electrically coupled to distribution line 198 between electric grid 199 and first electric load 103. In many embodiments, the first quantity of electricity provided to first electric load 103 can comprise the second quantity of electricity provided to second electric load 104 and/or a third quantity of electricity provided to third electric load 105.

Electric grid 199, main electric distribution line 198, and/or first measurement module 101 can comprise and/or can be part of metering infrastructure 195. In various embodiments, metering infrastructure 195 can comprise an advanced metering infrastructure of the one or more utility companies.

First measurement module 101 can be configured to coordinate measuring a first measurement of first electric load 103 while second measurement module 102 measures a second measurement of second electric load 104. Also, second measurement module 102 can be configured to coordinate measuring the second measurement of second electrical load 104 while first measurement module 101 measures the first measurement of first electric load 103. For example, in some embodiments, first measurement module 101 can be configured to approximately and/or exactly synchronize in time measuring the first measurement while the second measurement module 102 measures the second measurement, and/or vice versa.

In some embodiments, the first measurement and/or the second measurement can each comprise multiple measurements and/or can each comprise an average measurement of the multiple measurements taken over a particular duration of time (e.g., 5 minutes, 10 minutes, 15, minutes, 30 minutes, etc.). In these examples, first measurement module 101 can be configured to approximately and/or exactly synchronize in time measuring each of the measurements of the first measurement while second measurement module 102 measures each of the measurements of the second measurement. In the same or different examples, first measurement module 101 can be configured to approximately and/or exactly synchronize in time measuring the average measurement of each of the measurements of the first measurement while second measurement module 102 measures the average measurement of each of the measurements of the second measurement (e.g., approximately synchronizing the duration of time and/or the number of measurements the first measurement and the second measurement comprise). Said another way, by approximately and/or exactly synchronizing in time measuring the average measurement of each of the measurements of the first measurement while second measurement module 102 measures the average measurement of each of the measurements of the second measurement, the durations of time over which each of the average measurements of the multiple measurements are taken can also be approximately and/or exactly synchronized in time.

Coordination of the first measurement and the second measurement can be important, particularly, where the one or more electric utility companies are employing electricity billing schemes based on time of day and/or peak usage. For example, peak usage electricity pricing schemes may bill a customer for his or her electricity based on the highest electric load the consumer has during a particular duration of time. Accordingly, if the durations of time over which the first measurement and the second measurement are measured are not approximately synchronized, the peak usage for the first electric load may not be representative of the peak usage of the second electric load, i.e., the peak usages would not properly correspond.

The comparison for time of day billing provides an even more stark example of the importance of coordinating the measurements. For example, if the one or more electric utility companies charge different rates before and after 6:00 p.m. and the first measurement occurs at 5:59 p.m. and the second measurement occurs at 6:01 p.m., the first measurement and the second measurement will not correspond with each other properly. In other embodiments, first measurement module 101 can be configured to coordinate measuring the first measurement (while second measurement module 102 measures the second measurement) by: (a) measuring the first measurement with a similar or identical type of sensor employed by second measurement module 102 to measure the second measurement; (b) calibrating the sensor of first measurement module 101 similarly or identically to a calibration used to calibrate the sensor of second measurement module 102; (c) measuring the first measurement with the same representative units (e.g., metric units) that second measurement module 102 uses to measure the second measurement, etc. In still other embodiments, first measurement module 101 can be configured to coordinate measuring the first measurement which second measurement module 102 measures the second measurement using a numerical methodology as opposed to a mechanical methodology. In these examples, first measurement module 101 can convert the first measurement using mathematical and/or logical transformations in order to coordinate it with the second measurement. Any of the above examples could equally illustrate the manner in which second measurement module 102 might coordinate measuring the second measurement while first measurement module 101 measures the first measurement, but with respect to second measurement module 102.

In some embodiments, first measurement computer 141 can be configured to administrate coordination of measuring the first measurement with second measurement module 102 measuring the second measurement. Meanwhile, second measurement computer 142 can be similar or identical to first measurement computer 141, but with respect to second measurement module 102, instead of first measurement module 101. In still other embodiments, centralized computer system 106, as described below, can be configured to administrate coordination of first measurement module 101 and/or second measurement module 102. Centralized computer system 106 can administrate coordination of first measurement module 101 and/or second measurement module 102 via any or all of the exemplary methods provided above with respect to first measurement module 101 and/or second measurement module 102.

Figure 2:
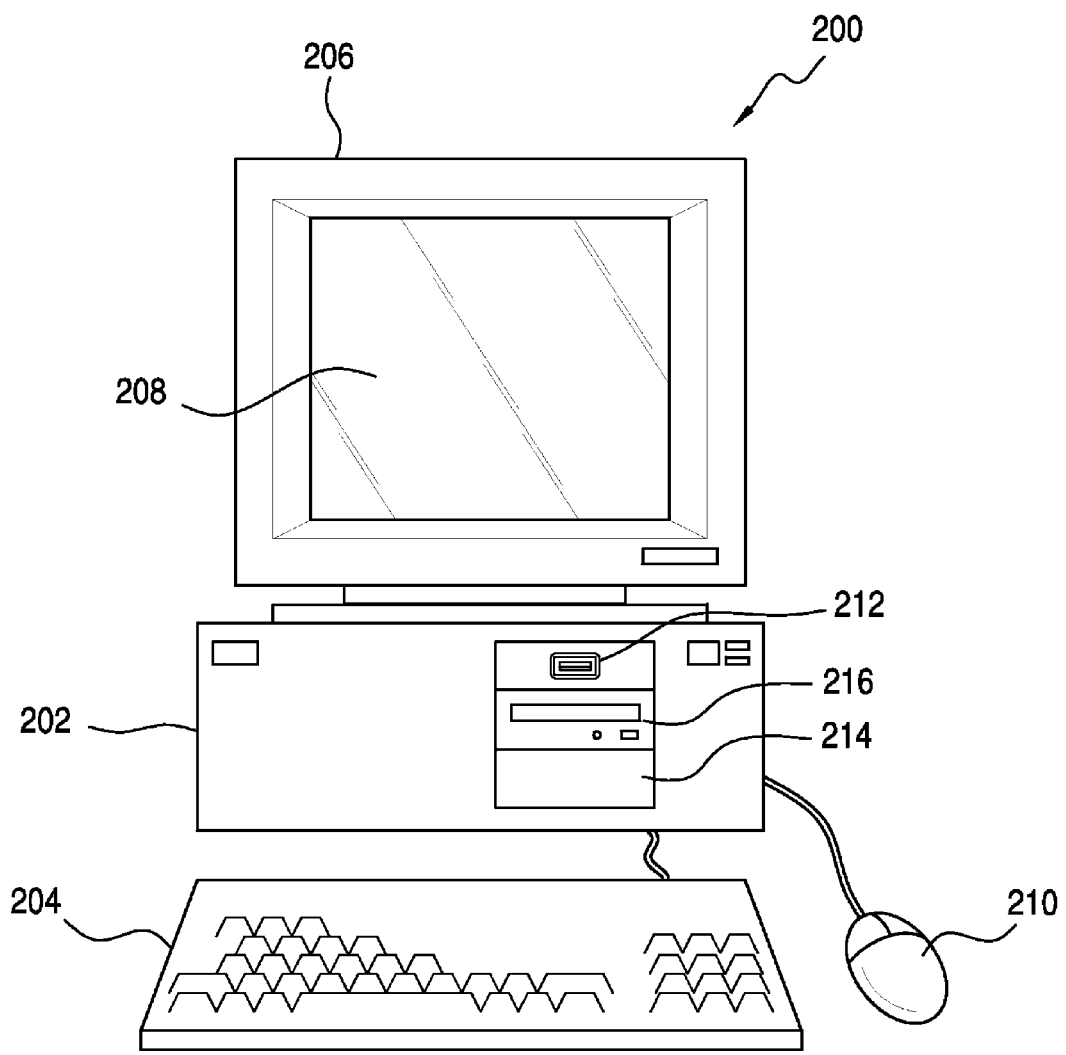
FIG. 2 illustrates a computer system that is suitable for implementing an embodiment of the system of FIG. 1.

First measurement computer 141 can be similar or identical to computer system 200 (FIG. 2). In other embodiments, first measurement computer 141 can comprise a microcontroller or various other similar, but less sophisticated, control systems than computer system 200 (FIG. 2) as illustrated. Further, in some embodiments, some or all of the functionality of first measurement computer 141 can alternatively or additionally be implemented as a first measurement application programmable interface (e.g., via cloud computing). As an example, the first measurement application programmable interface can communicate (e.g., via the communication network and/or a communication system of metering infrastructure 195, as described below) with one or more cloud computer systems, and can be operated (e.g., in the capacity of an interface only) at one or more processors and/or stored at one or more memory storage modules of first measurement computer 141 while the remaining functional aspects of first measurement computer 141, as described herein, are operable at one or more processors and/or storable at one or more memory storage modules of the cloud computer system(s). Accordingly, the cloud computer system(s) can each also be similar or identical to computer system 200 (FIG. 2). For convenience of illustration, first measurement computer 141 is generally described herein with respect to first measurement computer 141 only, but in many embodiments, reference to first measurement computer 141 can mean first measurement computer 141 and/or the charging station application programmable interface.

Likewise, second measurement computer 142 can also be similar or identical to computer system 200 (FIG. 2). In other embodiments, second measurement computer 142 can comprise a microcontroller or various other similar, but less sophisticated, control systems than computer system 200 (FIG. 2) as illustrated. Further, in some embodiments, some or all of the functionality of second measurement computer 142 can alternatively or additionally be implemented as a second measurement application programmable interface (e.g., via cloud computing). As an example, the second measurement application programmable interface can communicate (e.g., via the communication network and/or a communication system of metering infrastructure 195, as described below) with the cloud computer systems, and can be operated (e.g., in the capacity of an interface only) at one or more processors and/or stored at one or more memory storage modules of second measurement computer 142 while the remaining functional aspects of second measurement computer 142, as described herein, are operable at one or more processors and/or storable at one or more memory storage modules of the cloud computer system(s). Accordingly, the cloud computer system(s) can each also be similar or identical to computer system 200 (FIG. 2). For convenience of illustration, second measurement computer 142 is generally described herein with respect to second measurement computer 142 only, but in many embodiments, reference to second measurement computer 142 can mean second measurement computer 142 and/or the second measurement application programmable interface.

In order to coordinate the first measurement and the second measurement, (a) first measurement module 101 and/or first measurement computer 141 can be configured to reference the first time-keeping device in order to determine the time, (b) second measurement module 102 and/or second measurement computer 142 can be configured to reference the second time-keeping device in order to determine the time, and/or (c) centralized computer system 106 can be configured to reference the centralized time-keeping device in order to determine the time. Accordingly, the first time-keeping device, the second time-keeping device, and/or the centralized time-keeping device can be approximately synchronized with each other. In many embodiments, the first time-keeping device and/or the second time-keeping device can be configured to synchronize with the centralized time-keeping device, such as, for example, upon the occurrence of an event and/or upon the occurrence of a predetermined interval of time. Meanwhile, the first time-keeping device and/or the second time-keeping device can also be configured such that the first time-keeping device and/or the second time-keeping device will not attempt to resynchronize with the centralized time-keeping device and/or attempt to reset their respective times without receiving a command from centralized computer system 106. Thus, in the event that first measurement module 101 and/or second measurement module 102 lose communication with centralized computer system 106, lose electrical power, etc., the first time-keeping device and/or the second time-keeping device can be configured to maintain their last known time (e.g., as last synchronized with the central time-keeping device).

Meanwhile, like first measurement computer 141 and/or second measurement computer 142, centralized computer system 106 can also be similar or identical to computer system 200 (FIG. 2). Likewise, in some embodiments, some or all of the functionality of centralized computer system 106 can alternatively or additionally be implemented as a centralized application programmable interface (e.g., via cloud computing). As an example, the centralized application programmable interface can communicate (e.g., via the communication network and/or a communication system of metering infrastructure 195, as described below) with the cloud computer systems, and can be operated (e.g., in the capacity of an interface only) at one or more processors and/or stored at one or more memory storage modules of centralized computer system 106 while the remaining functional aspects of centralized computer system 106, as described herein, are operable at one or more processors and/or storable at one or more memory storage modules of the cloud computer system(s). For convenience of illustration, centralized computer system 106 is generally described herein with respect to centralized computer system 106 only, but in many embodiments, reference to centralized computer system 106 can mean centralized computer system 106 and/or the centralized application programmable interface.

Centralized computer system 106 can be located remotely from first measurement module 101 and/or second measurement module 102. In some examples, centralized computer system 106 can be operated by the one or more electric utility companies, and/or centralized computer system 106 can be located at a facility of the one or more electric utility companies. In the same or different embodiments, centralized computer system 106 can be operated by the operator of system 100 or a third-party.

In various embodiments, centralized computer system 106 can comprise one or more computer databases 109 configured to store one or more of the first measurement, the second measurement, and/or a net measurement, as described below, referenced collectively in some contexts as "measurement information." For example, computer database(s) 109 can be implemented as one or more of an XML (Extensible Markup Language) database, MySQL, or an Oracle® database. In many examples, the measurement information can be utilized for billing by the one or more electric utility companies. In other examples, the measurement information can be utilized by the one or more electric utility companies and/or third-parties to conduct business analytics. In still other examples, consumers can access the measurement information to review personal electricity usage and/or to view and evaluate electric billing information from the one or more electric utility companies via one or more interfaces (e.g., user profiles, electronic billing statements, etc.). In other embodiments, the one or more computer databases 109 can be separate and even geographically remote from, but still be in communication with, centralized computer system 106.

In some embodiments, second measurement module 102 can be configured to receive the first measurement from first measurement module 101, and/or first measurement module 101 can be configured to provide the first measurement to second measurement module 102. In the same or different embodiments, first measurement module 101 can be configured to receive the second measurement from second measurement module 102, and/or second measurement module 102 can be configured to provide the second measurement to first measurement module 101. As described above, in many embodiments, first measurement module 101 and second measurement module 102 can be configured to communicate with each other via the communication network. For example, in some embodiments, first measurement module 101 and second measurement module 102 can communicate with each other via wired and/or wireless communication via the communication network.

In the same or different embodiments, second measurement module 102 and/or second measurement computer 142 can be configured to subtract the second measurement (e.g., of the second quantity of electricity provided to electric vehicle charging station 132) from the first measurement (e.g., the first quantity or total quantity of electricity provided to the one or more buildings 150) to determine a net measurement of a net quantity (i.e., a third quantity of electricity provided to third electric load 105), thereby providing discrete measurements for the electricity provided to/from electric vehicle charging station 132 and third electric load 105 comprising one or more remaining electric loads of first electric load 103. In other embodiments, first measurement module 101 and/or first measurement computer 141 can be configured to subtract the second measurement from the first measurement to determine the net measurement of the net quantity of electricity. In other words, first measurement module 101 and/or second measurement module 102 can be configured to utilize, through subtractive metering, the first measurement and the second measurement in a mathematical formula to provide separate distinctive measurements for both the electricity provided to second electric load 104 (e.g., electric vehicle charging station) and the electricity provided (e.g., the net quantity) provided to third electric load 105 (e.g., the one or more buildings 150).

In still other embodiments, centralized computer system 106 can be configured to subtract the second measurement from the first measurement to determine the net measurement of the net quantity of electricity. In various embodiments, two or more of first measurement module 101/first measurement computer 141, second measurement module 102/second measurement computer 142, and/or centralized computer 106 can be configured to determine the net measurement, and one or more of first measurement module 101/first measurement computer 141, second measurement module 102/second measurement computer 142, and/or centralized computer system 106 can be configured to compare: (a) the first measurement the second measurement, and/or the net measurement of one of the two or more of first measurement module 101, second measurement module 102, and/or centralized computer system 106 against the first measurement, the second measurement; and/or (b) the net measurement of one or more others of the two or more of first measurement module 101, second measurement module 102, and/or centralized computer system 106, to validate any readings/measurements/calculations, etc.

In the same or different embodiments, first measurement module 101 and/or second measurement module 102 can be configured to communicate (e.g., via the communication network and/or a communication system of metering infrastructure 195, as described below) with centralized computer system 106 in order to provide centralized computer system 106 with the first measurement, the second measurement, and/or the net measurement (e.g., when one or both of first measurement module 101 and second measurement module 102 (rather than centralized computer 106) calculates the net measurement, or when centralized computer system 106 compares its net measurement against one or both net measurements of first measurement module 101 and second measurement module 102, etc.), alone or in any combination. Comparing the first measurement, the second measurement, and/or the net measurement can help verify the accuracy of the first measurement, the second measurement, and/or the net measurement. As a result, comparing the first measurement, the second measurement, and/or the net measurement can provide protection against electricity diversion and/or general tampering with system 100.

In many embodiments, first measurement module 101 and/or second measurement module 102 can be configured to communicate with centralized computer system 106 via one or more of a communication system of metering infrastructure 195 or the communication network. In many embodiments, the communication system of metering infrastructure 195 can be similar to the communication network but the communication system of metering infrastructure 195 is operated by the one or more electric utility companies.

In many embodiments, system 100 can be modified to accommodate one or more additional electric vehicle charging stations (other than electric vehicle charging station 132) in the same one of one or more buildings 150 using either second measurement module 102 or additional measurement modules (not shown in FIG. 1). Accordingly, when system 100 comprises the additional measurement modules, system 100 and/or its various components can be modified to coordinated the measurements of each of the additional measurement modules with the measurements of both first measurement module 101 and second measurement module 102 or with only the measurements of first measurement module 101. Likewise, the net measurement calculation can be modified to subtract the additional loads attributed to the additional electric vehicle charging stations.

Figure 3:
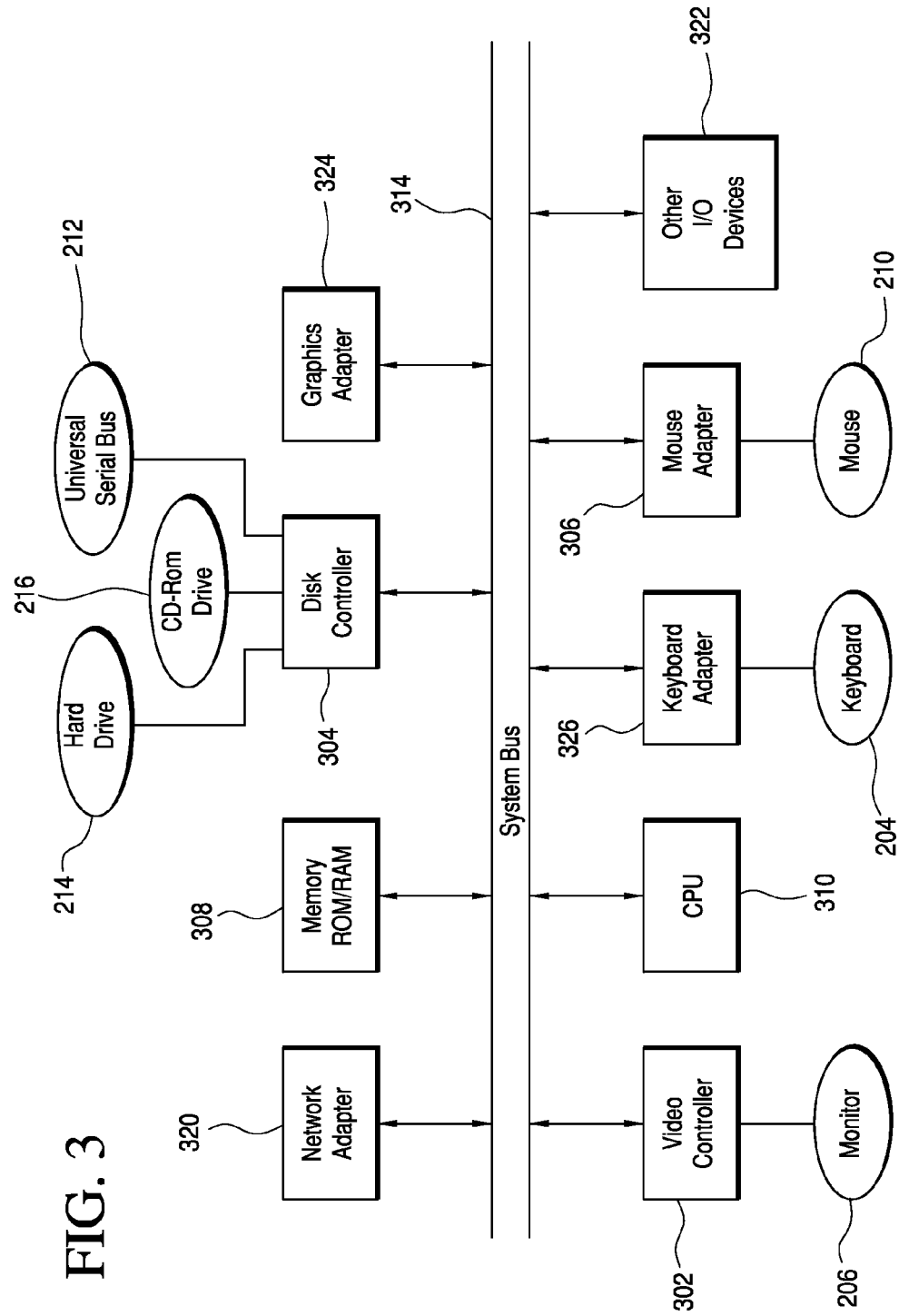
FIG. 3 illustrates a representative block diagram of an example of the elements included in the circuit boards inside chassis of the computer system of FIG. 2.
Figure 4:
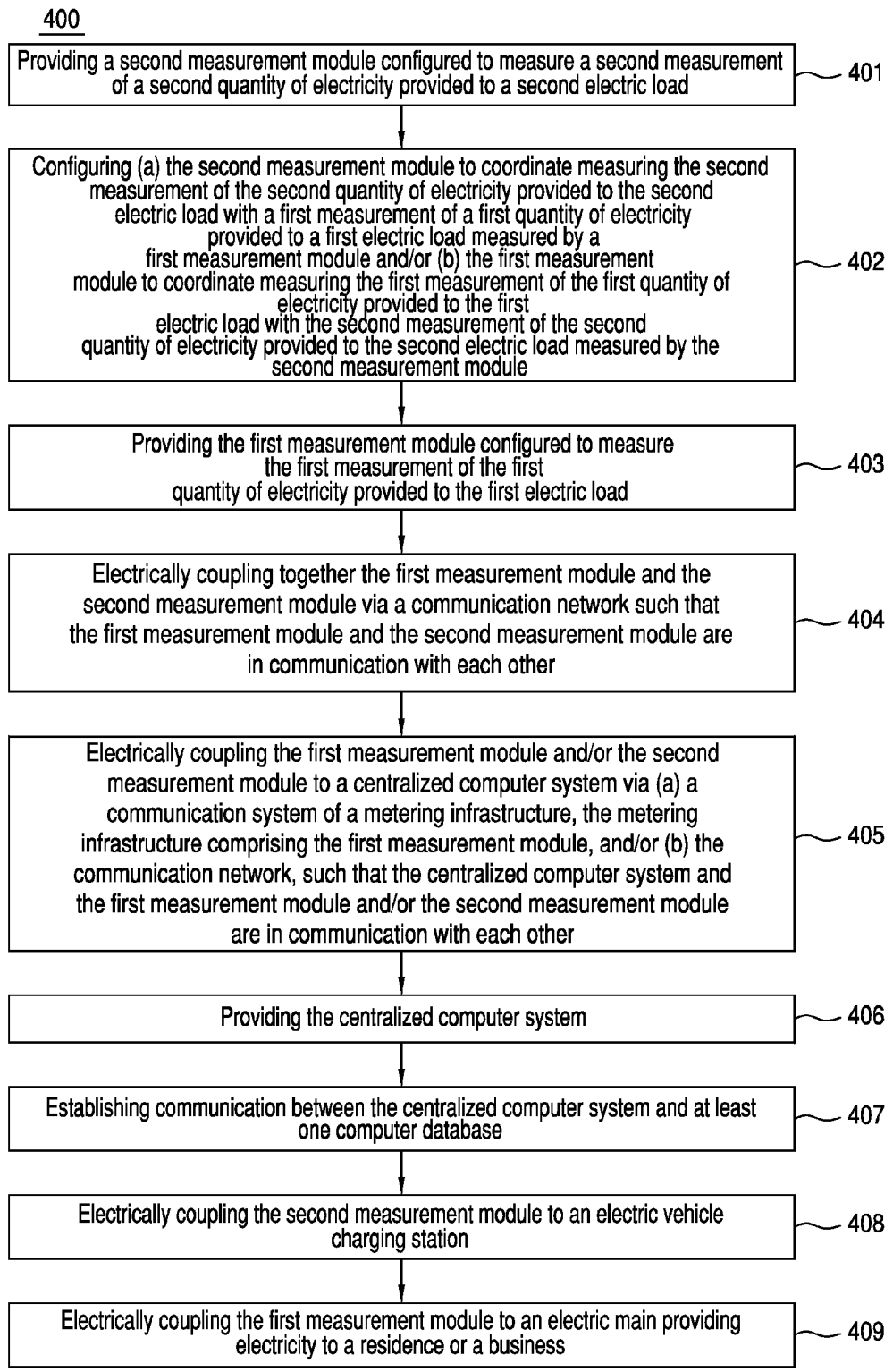
FIG. 4 illustrates a flow chart for an embodiment of a method of providing a system for measuring electricity, according to an embodiment.
Figure 5:
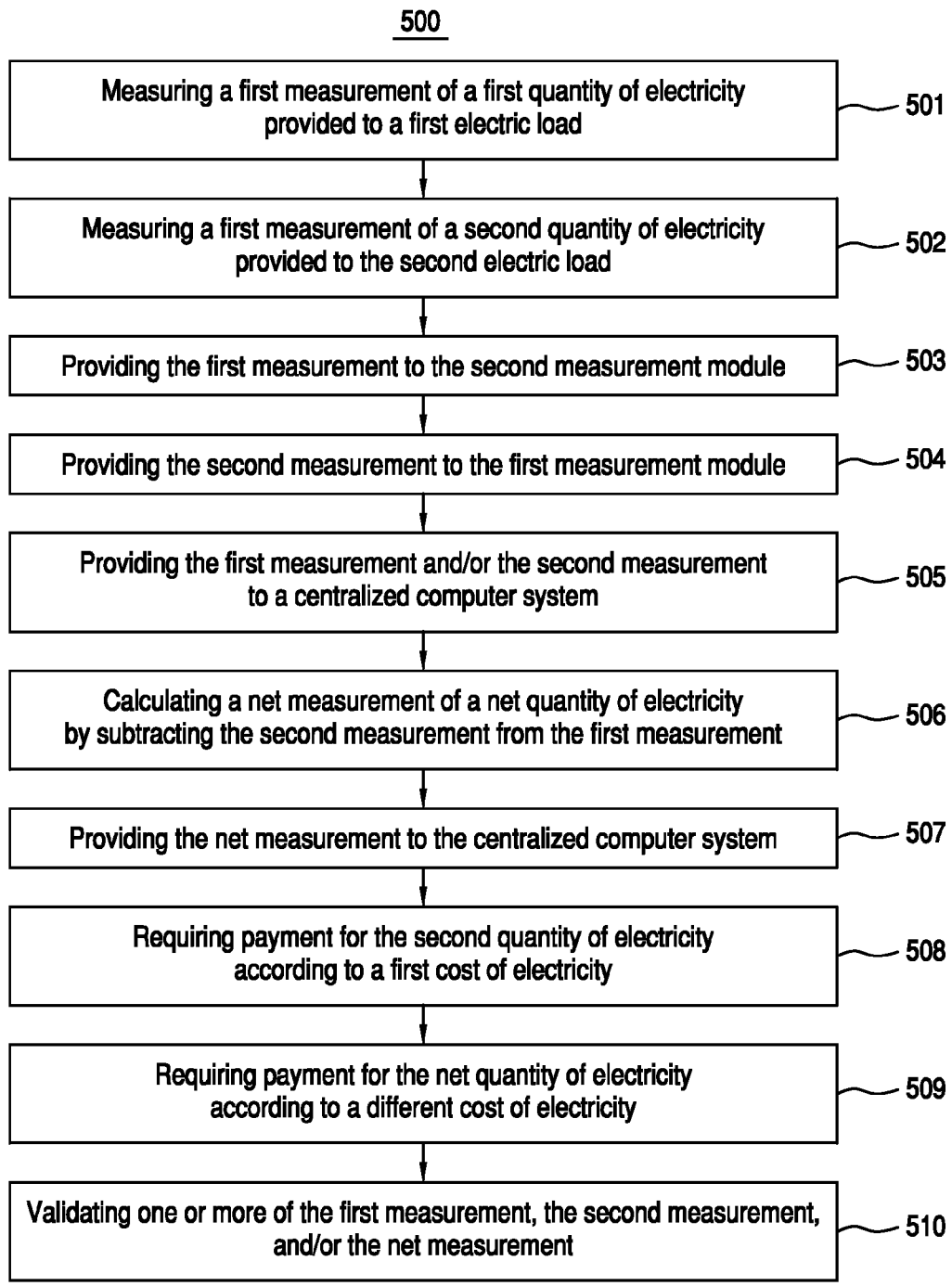
FIG. 5 illustrates a flow chart for an embodiment of a method of measuring electricity.

Turning to the next drawing, FIG. 2 illustrates an exemplary embodiment of computer system 200 that can be suitable for implementing an embodiment of first measurement computer 141, second measurement computer 142, centralized computer system 106, the cloud computer system(s) referenced with respect to system 100 (FIG. 1), and/or at least part of system 100 (FIG. 1), method 400 (FIG. 4), and/or method 500 (FIG. 5). As an example, a different or separate one of chassis 202 (and its internal components) can be suitable for implementing first measurement computer 141, second measurement computer 142, centralized computer system 106 (FIG. 1), etc. Furthermore, one or more elements of computer system 200 (e.g., refreshing monitor 206, keyboard 204, and/or mouse 210, etc.) can also be appropriate for implementing centralized computer system 106 (FIG. 1). Computer system 200 includes chassis 202 containing one or more circuit boards (not shown), Universal Serial Bus (USB) 212, Compact Disc Read-Only Memory (CD-ROM) and/or Digital Video Disc (DVD) drive 216, and hard drive 214. A representative block diagram of the elements included on the circuit boards inside chassis 202 is shown in FIG. 3. Central processing unit (CPU) 310 in FIG. 3 is coupled to system bus 314 in FIG. 3. In various embodiments, the architecture of CPU 310 can be compliant with any of a variety of commercially distributed architecture families.

Continuing with FIG. 3, system bus 314 also is coupled to memory storage unit 308, where memory storage unit 308 comprises both read only memory (ROM) and random access memory (RAM). Non-volatile portions of memory storage unit 308 or the ROM can be encoded with a boot code sequence suitable for restoring computer system 200 (FIG. 2) to a functional state after a system reset. In addition, memory storage unit 308 can comprise microcode such as a Basic Input-Output System (BIOS). In some examples, the one or more memory storage units of the various embodiments disclosed herein can comprise memory storage unit 308, a USB-equipped electronic device, such as, an external memory storage unit (not shown) coupled to universal serial bus (USB) port 212 (FIGS. 2-3), hard drive 214 (FIGS. 2-3), and/or CD-ROM or DVD drive 216 (FIGS. 2-3). In the same or different examples, the one or more memory storage units of the various embodiments disclosed herein can comprise an operating system, which can be a software program that manages the hardware and software resources of a computer and/or a computer network. The operating system can perform basic tasks such as, for example, controlling and allocating memory, prioritizing the processing of instructions, controlling input and output devices, facilitating networking, and managing files. Examples of common operating systems can include Microsoft® Windows, Mac® operating system (OS), UNIX® OS, and Linux® OS. Where computer system 200 is implemented as a mobile computer system (e.g., a smart phone, a tablet computer system, etc.), common operating systems for a mobile electronic device include the iPhone® operating system by Apple Inc. of Cupertino, Calif., the Blackberry® operating system by Research In Motion (RIM) of Waterloo, Ontario, Canada, the Palm® operating system by Palm, Inc. of Sunnyvale, Calif., the Android operating system developed by the Open Handset Alliance, the Windows Mobile operating system by Microsoft Corp. of Redmond, Wash., or the Symbian operating system by Nokia Corp. of Espoo, Finland.

As used herein, "processor" and/or "processing module" means any type of computational circuit, such as but not limited to a microprocessor, a microcontroller, a controller, a complex instruction set computing (CISC) microprocessor, a reduced instruction set computing (RISC) microprocessor, a very long instruction word (VLIW) microprocessor, a graphics processor, a digital signal processor, or any other type of processor or processing circuit capable of performing the desired functions.

In the depicted embodiment of FIG. 3, various I/O devices such as disk controller 304, graphics adapter 324, video controller 302, keyboard adapter 326, mouse adapter 306, network adapter 320, and other I/O devices 322 can be coupled to system bus 314. Keyboard adapter 326 and mouse adapter 306 are coupled to keyboard 204 (FIGS. 2-3) and mouse 210 (FIGS. 2-3), respectively, of computer system 200 (FIG. 2). While graphics adapter 324 and video controller 302 are indicated as distinct units in FIG. 3, video controller 302 can be integrated into graphics adapter 324, or vice versa in other embodiments. Video controller 302 is suitable for refreshing monitor 206 (FIGS. 2-3) to display images on a screen 208 (FIG. 2) of computer system 200 (FIG. 2). Disk controller 304 can control hard drive 214 (FIGS. 2-3), USB port 212 (FIGS. 2-3), and CD-ROM drive 216 (FIGS. 2-3). In other embodiments, distinct units can be used to control each of these devices separately.

In some embodiments, network adapter 320 can comprise and/or be implemented as a WNIC (wireless network interface controller) card (not shown) plugged or coupled to an expansion port (not shown) in computer system 200 (FIG. 2). In other embodiments, the WNIC card can be a wireless network card built into computer system 200 (FIG. 2). A wireless network adapter can be built into computer system 200 by having wireless communication capabilities integrated into the motherboard chipset (not shown), or implemented via one or more dedicated wireless communication chips (not shown), connected through a PCI (peripheral component interconnector) or a PCI express bus of computer system 200 (FIG. 2) or USB port 212 (FIG. 2). In other embodiments, network adapter 1320 can comprise and/or be implemented as a wired network interface controller card (not shown). Accordingly, the communication network described above with respect to system 100 (FIG. 1) can comprise a network adapter similar or identical to network adapter 1320.

Although many other components of computer system 200 (FIG. 2) are not shown, such components and their interconnection are well known to those of ordinary skill in the art. Accordingly, further details concerning the construction and composition of computer system 200 and the circuit boards inside chassis 202 (FIG. 2) are not discussed herein.

When computer system 200 in FIG. 2 is running, program instructions stored on a USB-equipped electronic device connected to USB port 212, on a CD-ROM or DVD in CD-ROM and/or DVD drive 216, on hard drive 214, or in memory storage unit 308 (FIG. 3) are executed by CPU 310 (FIG. 3). A portion of the program instructions, stored on these devices, can be suitable for carrying out at least part of method 400 and/or method 500 (FIGS. 4 & 5) and implementing one or more components of system 100.

Although computer system 200 is illustrated as a desktop computer in FIG. 2, as indicated above, there can be examples where computer system 200 may take a different form factor while still having functional elements similar to those described for computer system 200. In some embodiments, computer system 200 may comprise a single computer, a single server, or a cluster or collection of computers or servers, or a cloud of computers or servers. Typically, a cluster or collection of servers can be used when the demand on computer system 200 exceeds the reasonable capability of a single server or computer, such as, for example, for centralized computer system 106 (FIG. 1). In many embodiments, the servers in the cluster or collection of servers are interchangeable from the perspective of first measurement computer 141 (FIG. 1) and/or second measurement computer 142 (FIG. 1).

Meanwhile, in some embodiments, centralized computer system 106 (FIG. 1), first measurement computer 141 (FIG. 1), and/or second measurement computer 142 (FIG. 1) can have only those processing capabilities and/or memory storage capabilities as are reasonably necessary to perform the functionality, described above with respect to system 100 (FIG. 1). In a more detailed example, first measurement computer 141 (FIG. 1) and/or second measurement computer 142 (FIG. 1) could be implemented as a microcontroller comprising flash memory, or the like. Reducing the sophistication and/or complexity of centralized computer system 106 (FIG. 1), first measurement computer 141 (FIG. 1), and/or second measurement computer 142 (FIG. 1) can reduce the size and/or cost of implementing system 100 (FIG. 1). Nonetheless, in other embodiments, centralized computer system 106 (FIG. 1), first measurement computer 141 (FIG. 1), and/or second measurement computer 142 (FIG. 1) may need additional sophistication and/or complexity to operate as desired.

Turning ahead again in the drawings, FIG. 4 illustrates a flow chart for an embodiment of method 400 of providing a system for measuring electricity. Method 400 is merely exemplary and is not limited to the embodiments presented herein. Method 400 can be employed in many different embodiments or examples not specifically depicted or described herein. In some embodiments, the procedures, the processes, and/or the activities of method 400 can be performed in the order presented. In other embodiments, the procedures, the processes, and/or the activities of the method 400 can be performed in any other suitable order. In still other embodiments, one or more of the procedures, the processes, and/or the activities in method 400 can be combined or skipped. In some embodiments, method 400 or any of the procedures, the processes, and/or the activities of method 400 can be performed in real time. In many embodiments, the system for measuring electricity can be similar or identical to system 100 (FIG. 1).

Referring now to FIG. 4, method 400 comprises procedure 401 of providing a second measurement module configured to measure a second measurement of a second quantity of electricity provided to a second electric load. In many embodiments, the second measurement module can be similar or identical to second measurement module 102 (FIG. 1). In the same or different embodiments, the second electric load can be similar or identical to second electric load 104 (FIG. 1). In various embodiments, the second measurement and/or the second quantity of electricity can be similar or identical to the second measurement and/or the second quantity of electricity, respectively, described above with respect to system 100 (FIG. 1).

Referring again to FIG. 4, method 400 comprises procedure 402 of configuring at least one of (a) the second measurement module to coordinate measuring the second measurement of the second quantity of electricity provided to the second electric load with a first measurement of a first quantity of electricity provided to a first electric load measured by a first measurement module and/or (b) the first measurement module to coordinate measuring the first measurement of the first quantity of electricity provided to the first electric load with the second measurement of the second quantity of electricity provided to the second electric load measured by the second measurement module. In many embodiments, the first measurement module can be similar or identical to first measurement module 101 (FIG. 1). In the same or different embodiments, the first electric load can be similar or identical to first electric load 103 (FIG. 1). In various embodiments, the first measurement and/or the first quantity of electricity can be similar to the first measurement and/or the first quantity of electricity, respectively, described above with respect to system 100 (FIG. 1).

Referring again to FIG. 4, in some embodiments, method 400 can comprise procedure 403 of providing the first measurement module configured to measure the first measurement of the first quantity of electricity provided to the first electric load. In some embodiments, procedure 403 can be performed when an existing first measurement module is not present, when the existing first measurement module cannot be modified to operate with system 100 (FIG. 1), and/or when replacing an antiquated first measurement module with a new first measurement module would increase the efficiency and/or accuracy of the system of method 400.

Referring again to FIG. 4, in some embodiments, method 400 can comprise procedure 404 of electrically coupling together the first measurement module and the second measurement module via a communication network such that the first measurement module and the second measurement module are in communication with each other. In some embodiments, performing procedure 404 can be similar or identical to electrically coupling together first measurement module 101 (FIG. 1) and second measurement module 102 (FIG. 1), as described above with respect to system 100 (FIG. 1). The communication network can be similar or identical to the communication network described above with respect to system 100 (FIG. 1).

Referring again to FIG. 4, in some embodiments, method 400 can comprise procedure 405 of electrically coupling the first measurement module and/or the second measurement module to a centralized computer system via (a) a communication system of a metering infrastructure, the metering infrastructure comprising the first measurement module, and/or (b) the communication network, such that the centralized computer system and the first measurement module and/or the second measurement module are in communication with each other. In some embodiments, the centralized computer system can be similar or identical to centralized computer system 106 (FIG. 1). In the same or different embodiments, performing procedure 405 can be similar or identical to electrically coupling first measurement module 101 (FIG. 1) and/or second measurement module 102 (FIG. 1) together with centralized computer system 106 (FIG. 1), as described above with respect to system 100 (FIG. 1). In some embodiments, the metering infrastructure can be similar or identical to metering infrastructure 195 (FIG. 1), and the communication system of the metering infrastructure can be similar or identical to the communication system of the metering infrastructure described above with respect to metering infrastructure 195 (FIG. 1).

Referring again to FIG. 4, in some embodiments, method 400 can comprise procedure 406 of providing the centralized computer system.

Referring again to FIG. 4, in some embodiments, method 400 can comprise procedure 407 of establishing communication between the centralized computer system and at least one computer database. The at least one computer database can be similar or identical to the one or more computer databases 109 (FIG. 1).

Referring again to FIG. 4, in some embodiments, method 400 can comprise procedure 408 of electrically coupling the second measurement module to an electric vehicle charging station. In some embodiments, the electric vehicle charging station can be similar or identical to electric vehicle charging station 132 (FIG. 1).

Referring again to FIG. 4, in some embodiments, method 400 can comprise procedure 409 of electrically coupling the first measurement module to an electric main providing electricity to a residence or a business. In some embodiments, the electric main can be similar or identical to main electric distribution line 198.

In various embodiments, at least part of method 400 can be implemented via execution of computer instructions configured to run at one or more processing modules and configured to be stored at one or more memory storage modules of one or more computer systems. The computer system(s) can be similar or identical to first measurement computer 141 (FIG. 1), second measurement computer 142 (FIG. 1), centralized computer system 106 (FIG. 1), and/or computer system 200 (FIG. 2), as described above. Accordingly, the one or more processing modules and/or the one or more memory storage modules can be similar or identical to the processing modules and/or storage modules described above with respect to computer system 200 (FIG. 2).

FIG. 5 illustrates a flow chart for an embodiment of method 500 of measuring electricity. Method 500 is merely exemplary and is not limited to the embodiments presented herein. Method 500 can be employed in many different embodiments or examples not specifically depicted or described herein. In some embodiments, the procedures, the processes, and/or the activities of method 500 can be performed in the order presented. In other embodiments, the procedures, the processes, and/or the activities of method 500 can be performed in any other suitable order. In still other embodiments, one or more of the procedures, the processes, and/or the activities of method 500 can be combined or skipped. In some embodiments, method 500 or any of the procedures, the processes, and/or the activities of method 500 can be performed in real time.

Referring to FIG. 5, method 500 comprises procedure 501 of measuring a first measurement of a first quantity of electricity provided to a first electric load. In some embodiments, the first electric load can be similar or identical to first electric load 103. In various embodiments, the first measurement and/or the first quantity of electricity can be similar or identical to the first measurement and/or the first quantity of electricity, respectively, described above with respect to system 100 (FIG. 1). In the same or different embodiments, procedure 501 can comprise measuring the first measurement with a first measurement module. In some embodiments, the first measurement module can be similar or identical to first measurement module 101 (FIG. 1). In some embodiments, procedure 501 can comprise measuring a gross quantity of electricity provided to one or more buildings, the one or more buildings comprising an electric vehicle charging station. In various embodiments, the one or more buildings can be similar or identical to one or more buildings 150 described above with respect to system 100 (FIG. 1).

Referring again to FIG. 5, method 500 comprises procedure 502 of measuring a second measurement of the second quantity of electricity provided to the second electric load. In some embodiments, the second electric load can be similar or identical to second electric load 104. In various embodiments, the second measurement and/or the second quantity of electricity can be similar or identical to the second measurement and/or the second quantity of electricity, respectively, described above with respect to system 100 (FIG. 1). In the same or different embodiments, procedure 502 can comprise measuring the second measurement with a second measurement module. In some embodiments, the second measurement module can be similar or identical to second measurement module 102 (FIG. 1). In some embodiments, the second measurement module can be located separately from the first measurement module. In some embodiments, procedure 502 can comprise measuring a subordinate quantity of electricity (i.e., a constituent part of the gross quantity of electricity) provided to the electric vehicle charging station to charge a rechargeable energy storage system of an electric vehicle. In various embodiments, the rechargeable energy storage system and/or the electric vehicle can be similar or identical to rechargeable energy storage system 107 (FIG. 1) and/or electric vehicle 108 (FIG. 1), respectively.

In many embodiments, procedure 501 can be coordinated with procedure 502, and/or procedure 502 can be coordinated with procedure 501. Coordinating procedure 501 with procedure 502, or vice versa, can be similar or identical to coordinating the first measurement with the second measurement, or vice versa, as described above with respect to system 100 (FIG. 1).

Referring again to FIG. 5, in some embodiments, method 500 can comprise procedure 503 of providing the first measurement to the second measurement module. In some embodiments, procedure 503 can comprise providing the first measurement to the second measurement module via a communication network. The communication network can be similar or identical to the communication network described above with respect to system 100 (FIG. 1).

Referring again to FIG. 5, in some embodiments, method 500 can comprise procedure 504 of providing the second measurement to the first measurement module. In some embodiments, procedure 504 can comprise providing the second measurement to the first measurement module via the communication network. In some embodiments where procedure 504 is used, procedure 504 can be omitted, and in some embodiments where procedure 504 is used, procedure 503 can be omitted.

Referring again to FIG. 5, in some embodiments, method 500 can comprise procedure 505 of providing the first measurement and/or the second measurement to a centralized computer system. In various embodiments, the centralized computer system can be similar or identical to centralized computer system 106 (FIG. 1). In the same or different embodiments, procedure 505 can comprise providing the first measurement and/or the second measurement to the centralized computer system via (a) a communication system of a metering infrastructure, the metering infrastructure comprising the first measurement module and/or (b) the communication network, such that the centralized computer system and the first measurement module and/or the second measurement module are in communication with each other. In various embodiments, the metering infrastructure can be similar or identical to metering infrastructure 195 (FIG. 1), and the communication system of the metering infrastructure can be similar or identical to the communication system of the metering infrastructure described above with respect to metering infrastructure 195 (FIG. 1).

Referring again to FIG. 5, in some embodiments, method 500 can comprise procedure 506 of calculating a net measurement of a net quantity of electricity by subtracting the second measurement from the first measurement. In some embodiments, procedure 506 can comprise calculating the net measurement of the net quantity of electricity by subtracting the second measurement from the first measurement with and/or at the first measurement module, the second measurement module, and/or the centralized computer system.

Referring again to FIG. 5, in some embodiments, method 500 can comprise procedure 507 of providing the net measurement to the centralized computer system. In the same or different embodiments, procedure 507 can comprise providing the net measurement to the centralized computer system from the first measurement module and/or the second measurement module. In various embodiments, procedure 507 can be omitted.

Referring again to FIG. 5, in some embodiments, method 500 can comprise: (a) procedure 508 of requiring payment for the second quantity of electricity according to a first cost of electricity; and/or (b) procedure 509 of requiring payment for the net quantity of electricity according to a different cost of electricity. In various embodiments, the first cost can be less or more than the different cost. For example, the first cost can be less than the different cost when an electric utility company wants to incentivize consumers to use and/or charge electric vehicles, and/or when the electric utility company wants to discourage consumers from using electricity for other purposes.

Referring again to FIG. 5, in many embodiments, method 500 can comprise procedure 510 of validating one or more of the first measurement, the second measurement, and/or the net measurement. Performing procedure 510 can be similar or identical to comparing one or more first measurements of the first measurement, the second measurement, and/or the net measurement to one or more second measurements of the first measurement, the second measurement, and/or the net measurement, as described above with respect to system 100 (FIG. 1). Performing procedure 510 can help to ensure the accuracy of the first measurement, the second measurement, and/or the net measurement.

In some embodiments, method 500 can be modified to include additional procedures, processes, and/or activities to accommodate multiple electric vehicle charging stations. For example, method 500 can comprise additional measurement procedures, communication procedures, and/or calculation procedures to determine a net quantity of electricity attributed to electric devices other than one or more electric vehicle charging stations. In the same or different embodiments, the additional measurement procedures can be coordinated with one or more of the provided measurement procedures.

In various embodiments, at least part of method 500 can be implemented via execution of computer instructions configured to run at one or more processing modules and configured to be stored at one or more memory storage modules of one or more computer systems. The computer system(s) can be similar or identical to first measurement computer 141 (FIG. 1), second measurement computer 142 (FIG. 1), centralized computer system 106 (FIG. 1), and/or computer system 200 (FIG. 2), as described above. Accordingly, the one or more processing modules and/or the one or more memory storage modules can be similar or identical to the processing modules and/or storage modules described above with respect to computer system 200 (FIG. 2).

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that procedures 401-409 (FIG. 4) and procedures 501-510 (FIG. 5) may be comprised of many different procedures, processes, and activities and be performed by many different modules, in many different orders, that any element of FIGS. 1-5 may be modified, and that the foregoing discussion of certain of these embodiments does not necessarily represent a complete description of all possible embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are expressly stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

The invention claimed is:

1. A system for measuring electricity, the system comprising:
   a first measurement software module configured to measure a first measurement of a first quantity of electricity provided to a first electric load, the first measurement software module being configured to run at one or more first processing modules of a first measurement computer and configured to be stored in one or more first non-transitory memory storage modules of the first measurement computer; and
   a second measurement software module configured to measure a second measurement of a second quantity of electricity provided to a second electric load, the second measurement software module being configured to run at one or more second processing modules of a second measurement computer and configured to be stored in one or more second non-transitory memory storage modules of the second measurement computer;
   wherein:
      the first electric load comprises the second electric load and a third electric load;
      the second electric load comprises an electric load of an electric vehicle charging station;
      the first quantity of electricity provided to the first electric load comprises the second quantity of electricity provided to the second electric load; and
      at least one of: (a) the first measurement software module is configured to approximately synchronize at a clock time measuring the first measurement with the second measurement software module measuring the second measurement or (b) the second measurement software module is configured to approximately synchronize at the clock time measuring the second measurement with the first measurement software module measuring the first measurement.

2. The system of claim 1 wherein:
the second measurement software module is configured to receive the first measurement from the first measurement software module, to subtract the second measurement from the first measurement to determine a net measurement of a net quantity of electricity, and to communicate with a centralized computer system in order to provide the centralized computer system with at least one of the first measurement, the second measurement, or the net measurement.

3. The system of claim 1 wherein:
the second measurement software module is configured to provide the second measurement to the first measurement software module; and
the first measurement software module is configured to subtract the second measurement from the first measurement to determine a net measurement of a net quantity of electricity and to communicate with a centralized computer system in order to provide the centralized computer system with at least one of the first measurement, the second measurement, or the net measurement.

4. The system of claim 1 wherein:
at least one of: (a) the first measurement software module is configured to receive the second measurement from the second measurement software module and to communicate with a centralized computer system in order to provide the centralized computer system with the first measurement and the second measurement; (b) the second measurement software module is configured to provide the second measurement to the first measurement software module, and the first measurement software module is configured to communicate with the centralized computer system in order to provide the centralized computer system with the first measurement and the second measurement; or (c) the first measurement software module is configured to communicate with the centralized computer system in order to provide the centralized computer system with the first measurement, and the second measurement software module is configured to communicate with the centralized computer system in order to provide the centralized computer system with the second measurement; and
the centralized computer system is configured to subtract the second measurement from the first measurement to determine a net measurement of a net quantity of electricity.

5. The system of claim 1 wherein:
the first measurement software module and the second measurement software module are configured to communicate with each other via a communication network.

6. The system of claim 2 wherein:
at least one of the first measurement software module or the second measurement software module is configured to communicate with the centralized computer system via at least one of:
   a communication system of a metering infrastructure, the metering infrastructure comprising the first measurement computer; or
   a communication network.

7. The system of claim 2 wherein:

the system comprises at least one of the first measurement computer, the second measurement computer, or the centralized computer system.

8. The system of claim 2 wherein:

the centralized computer system comprises at least one computer database configured to store at least one of the first measurement, the second measurement, or the net measurement.

9. The system of claim 1 wherein:

the electric vehicle charging station comprises the second measurement computer.

10. The system of claim 1 wherein:

the first electric load comprises an electric load of one of a personal residence or a business; and the electric load of the one of the personal residence or the business comprises the second electric load and the third electric load.

11. The system of claim 1 wherein:

the third electric load comprises a structure electric load that is for a structure comprising the electric vehicle charging station and that is devoid of the electric load of the electric vehicle charging station.

12. The system of claim 1 wherein:

the electric load of the electric vehicle charging station comprises a vehicle electric load provided from the electric vehicle charging station to a rechargeable energy storage system of an electric vehicle.

13. The system of claim 1 wherein:

the third electric load comprises an electric load of a second electric vehicle charging station.

14. The system of claim 13 further comprising:

a third measurement software module configured to measure a third measurement of a third quantity of electricity provided to the third electric load, the third measurement software module being configured to run at one or more third processing modules of a third measurement computer and configured to be stored in one or more third non-transitory memory storage modules of the third measurement computer;

the first electric load further comprises a fourth electric load;

the first quantity of electricity provided to the first electric load comprises the second quantity of electricity provided to the second electric load and the third quantity of electricity provided to the third electric load; and at least one of: (a) the first measurement software module is configured to approximately synchronize at the clock time measuring the first measurement with the second measurement software module measuring the second measurement and the third measurement software module measuring the third measurement, (b) the second measurement software module is configured to approximately synchronize at the clock time measuring the second measurement with the first measurement software module measuring the first measurement and the third measurement software module measuring the third measurement, or (c) the third measurement software module is configured to approximately synchronize at the clock time measuring the third measurement with the first measurement software module measuring the first measurement and the second measurement software module measuring the second measurement.

15. A method of providing a system for measuring electricity, the method comprising:

providing a second measurement software module configured to measure a second measurement of a second quantity of electricity provided to a second electric load, the second electric load comprising an electric load of an electric vehicle charging station and the second measurement software module being configured to run at one or more second processing modules of a second measurement computer and configured to be stored in one or more second non-transitory memory storage modules of the second measurement computer; and configuring at least one of: (a) the second measurement software module to approximately synchronize at a clock time measuring the second measurement of the second quantity of electricity provided to the second electric load with a first measurement of a first quantity of electricity provided to a first electric load measured by a first measurement software module or (b) the first measurement software module to approximately synchronize at the clock time measuring the first measurement of the first quantity of electricity provided to the first electric load with the second measurement of the second quantity of electricity provided to the second electric load measured by the second measurement software module, the first measurement software module being configured to run at one or more first processing modules of a first measurement computer and configured to be stored in one or more first non-transitory memory storage modules of the first measurement computer;

wherein:

the first electric load comprises the second electric load and a third electric load; and the first quantity of electricity provided to the first electric load comprises the second quantity of electricity provided to the second electric load.

16. The method of claim 15 further comprising:

providing the first measurement software module configured to measure the first measurement of the first quantity of electricity provided to the first electric load.

17. The method of claim 15 further comprising:

electrically coupling together the first measurement software module and the second measurement software module via a communication network such that the first measurement software module and the second measurement software module are in communication with each other.

18. The method of claim 15 further comprising:

electrically coupling at least one of the first measurement software module or the second measurement software module to a centralized computer system via at least one of: (a) a communication system of a metering infrastructure, the metering infrastructure comprising the first measurement computer, or (b) a communication network, such that the centralized computer system and the at least one of the first measurement software module or the second measurement software module are in communication with each other.

19. The method of claim 18 further comprising:

providing the centralized computer system.

20. The method of claim 19 further comprising:

establishing communication between the centralized computer system and at least one computer database.

21. The method of claim 15 further comprising:

electrically coupling the second measurement computer to the electric vehicle charging station.

22. The method of claim 15 further comprising:
electrically coupling the first measurement computer to an electric main providing electricity to a residence or a business.

23. A method of measuring electricity, the method comprising:
measuring a first measurement of a first quantity of electricity provided to a first electric load, the first electric load comprising a second electric load of an electric vehicle charging station and a third electric load, and the first quantity of electricity comprising a second quantity of electricity provided to the second electric load; and
measuring a second measurement of the second quantity of electricity provided to the second electric load;
wherein:
at least one of: (a) measuring the first measurement is approximately synchronized at a clock time with measuring the second measurement or (b) measuring the second measurement is approximately synchronized at the clock time with measuring the first measurement.

24. The method of claim 23 wherein:
measuring the first measurement of the first quantity of electricity provided to the first electric load comprises measuring the first measurement with a first measurement module; and
measuring the second measurement of the second quantity of electricity provided to the second electric load comprises measuring the second measurement with a second measurement module separate from the first measurement module.

25. The method of claim 24 further comprising:
providing the first measurement to the second measurement module.

26. The method of claim 24 further comprising:
providing the second measurement to the first measurement module.

27. The method of claim 23 further comprising:
providing at least one of the first measurement or the second measurement to a centralized computer system.

28. The method of claim 23 further comprising:
calculating a net measurement of a net quantity of electricity by subtracting the second measurement from the first measurement.

29. The method of claim 28 further comprising:
providing the net measurement to a centralized computer system.

30. The method of claim 28 further comprising:
requiring payment for the second quantity of electricity according to a first cost of electricity; and
requiring payment for the net quantity of electricity according to a different cost of electricity.

31. The method of claim 23 wherein:
measuring the first measurement of the first quantity of electricity provided to the first electric load comprises measuring a gross quantity of electricity provided to one of a residence comprising the electric vehicle charging station or a business comprising the electric vehicle charging station; and
measuring the second measurement of the second quantity of electricity provided to the second electric load comprises measuring a subordinate quantity of electricity provided to the electric vehicle charging station to charge a rechargeable energy storage system of an electric vehicle.

32. The method of claim 23 further comprising:
referencing at least one clock to determine the clock time when performing at least one of: measuring the first measurement or measuring the second measurement.

* * * * *